United States Patent
Matsui

(10) Patent No.: US 6,753,486 B2
(45) Date of Patent: Jun. 22, 2004

(54) ELECTRONIC DEVICE SWITCH

(75) Inventor: Tsuyoshi Matsui, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/345,758

(22) Filed: Jan. 16, 2003

(65) Prior Publication Data

US 2003/0141174 A1 Jul. 31, 2003

(30) Foreign Application Priority Data

Jan. 24, 2002 (JP) .................................. 2002-015335

(51) Int. Cl.[7] ............................................... H01H 3/16
(52) U.S. Cl. ................ 200/61.41; 200/52 R; 200/38 C; 200/282
(58) Field of Search ........................ 200/61.41, 61.42, 200/61.43, 16, 52 R, 61.19, 38, 282, 280, 292

(56) References Cited

U.S. PATENT DOCUMENTS

| | | | | | |
|---|---|---|---|---|---|
| 4,746,771 A | * | 5/1988 | Koslar | ...................... | 200/16 D |
| 5,734,138 A | * | 3/1998 | Goto | ........................ | 200/16 R |
| 6,329,621 B1 | * | 12/2001 | Priesemuth | ................. | 200/537 |

* cited by examiner

*Primary Examiner*—Lincoln Donovan
*Assistant Examiner*—K. Lee
(74) *Attorney, Agent, or Firm*—Adams & Wilks

(57) ABSTRACT

An electronic device switch has switch patterns formed in positions close to a peripheral edge on a surface of a circuit board. A power source pattern is formed on a side surface of the circuit board. A terminal has a fixing leg, a connection leg disposed in contact with any of the switch patterns and cooperating with the fixing leg to clamp the terminal to the circuit board, and a switch terminal electrically connected with the connection leg and for undergoing plastic deformation to contact the power source pattern.

20 Claims, 11 Drawing Sheets

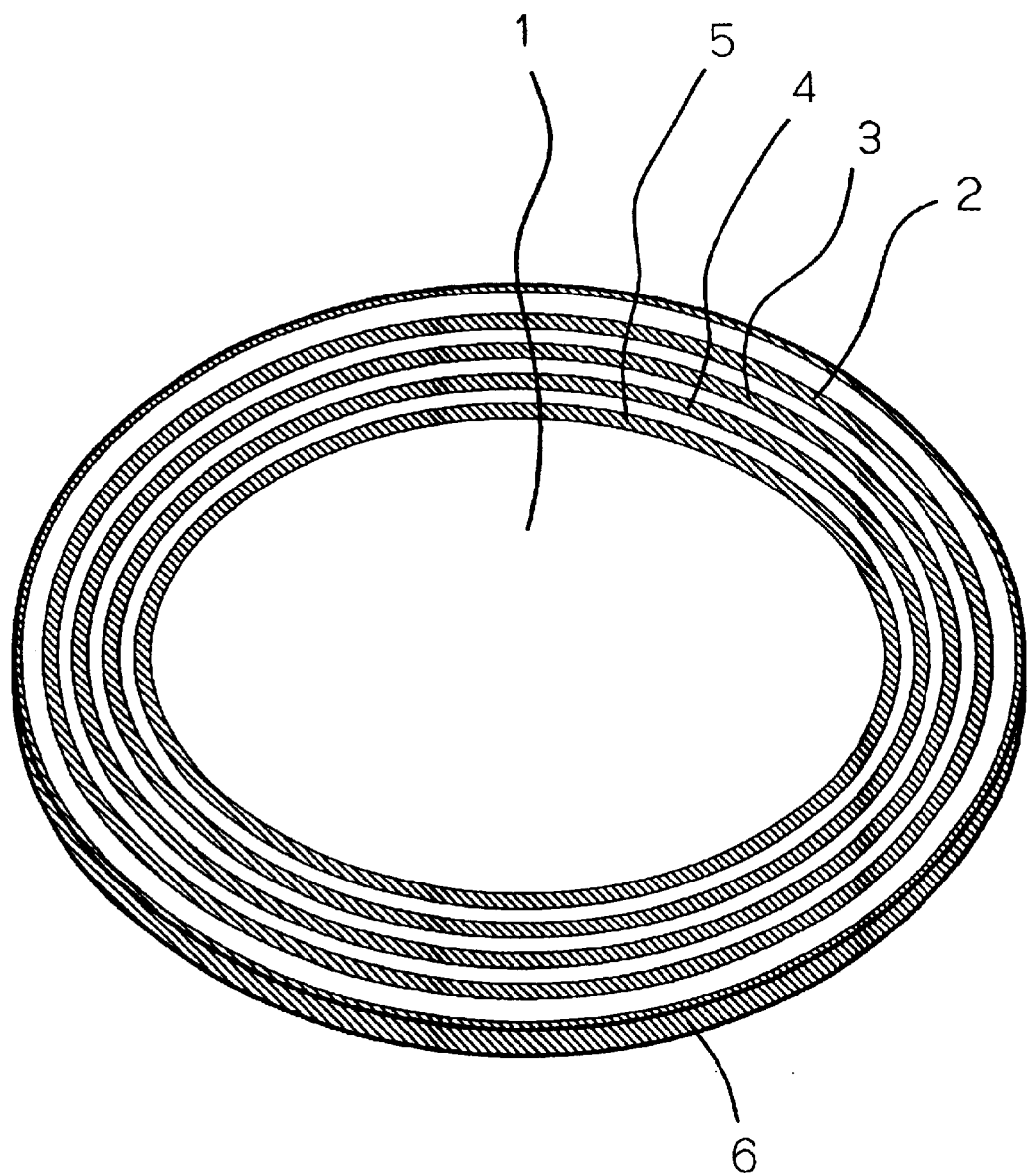

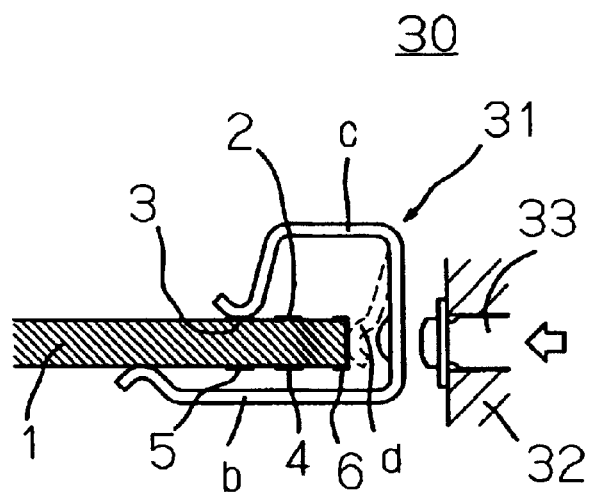
FIG. 4A
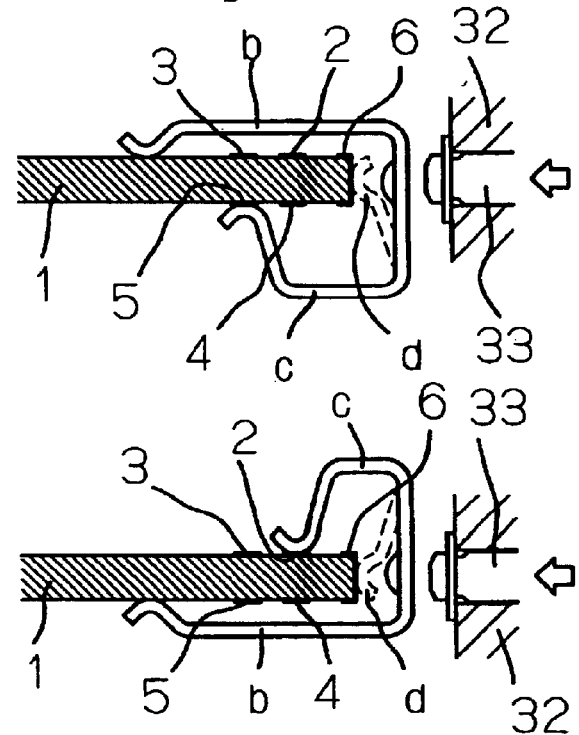
FIG. 4B
FIG. 4C
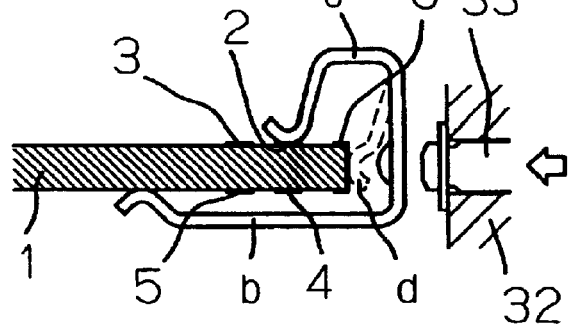
FIG. 4D
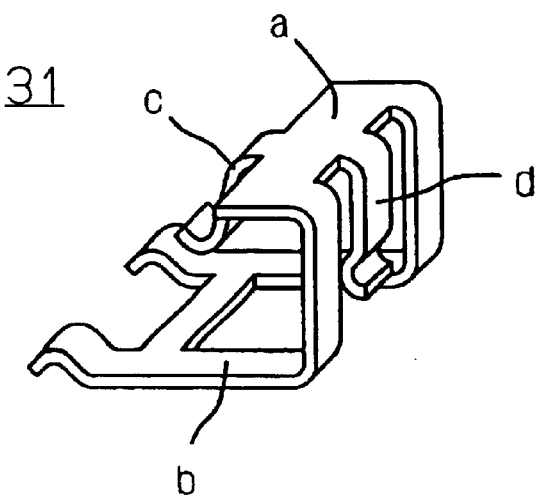

ELECTRONIC DEVICE SWITCH

FIELD OF THE INVENTION

The present invention relates to an electronic switch structure constructed on a circuit board constituting a module to be accommodated in an electronic device and, more specifically, to an electronic device switch which can be used without changing the exterior design of a circuit board, such as a button position.

FIG. 11 is a concept view showing a conventional switch structure 90 of an electronic device. In this electronic-device switch structure 90, switch terminals 92 are provided on side surfaces of a circuit board 91 to arrange switch springs 93 having contacts 93a to the terminals 92. The switch spring 93 is pushed in by a switch 94 provided on an exterior of the electronic device, to electrically connect between the switch contact 93a and the terminal 92 on the circuit-board 91 side by an elastic force of the switch spring 93.

The terminals 92 on the circuit board 91 are provided in plurality in desired positions wherein switch springs 93 are arranged for the respective terminals 92. The terminals 92 on the circuit board 91 are connected to the electronic parts mounted on the circuit board 91.

In the meanwhile, in such an electronic apparatus as a wristwatch or cellular phone, there are cases to accommodate the same modules in different exteriors. In such a case, the circuit board if different in terminal position results in a restriction to exterior design. For this reason, where priority is placed on exterior design, there is a need to change the terminal position on the circuit board in order for re-designing.

SUMMARY OF THE INVENTION

It is therefore an object of the present invention provide an electronic device switch to be used without changing the design of a circuit board of an electronic device even where change is made to the exterior design of the circuit board, particularly a button position.

An electronic device switch according to the present invention has a plurality of switch patterns formed substantially parallel one with another in positions close to a peripheral edge on a surface of a circuit board, a power source pattern formed on a side surface of the circuit board, and a terminal having a fixing leg, a connection leg provided in contact with any of the switch patterns and fixed by clamping the circuit board cooperatively with the fixing leg, and a switch terminal positioned substantially opposed to the power source pattern and electrically connected with the connection leg to be elastically deformed into possible contact with the power source pattern.

In another electronic device switch according to the present invention, the switch terminal is substantially opposed to the power source pattern and bent at the relevant position to extend to an opposite surface of the circuit board to a surface forming the switch patterns.

A further electronic device switch according to the present invention has a plurality of switch patterns formed substantially parallel one with another in positions close to a peripheral edge on both surfaces of a circuit board, a power source pattern formed on a side surface of the circuit board, and a terminal having a fixing leg, a connection leg provided in contact with any of the switch patterns in either an ordinal position or an inverted position of the terminal and fixed by clamping the circuit board cooperatively with the fixing leg, and a switch terminal positioned substantially opposed to the power source pattern and electrically connected with the connection leg to be elastically deformed into possible contact with the power source pattern.

In a further electronic device switch according to the invention, the switch patterns are formed substantially not parallel one with another but in an array form.

A further electronic device switch according to the invention has a plurality of switch patterns formed substantially parallel one with another in positions close to a peripheral edge on a surface of a circuit board, a power source pattern formed on a side surface of the circuit board, and a terminal having a plurality of recesses in a terminal housing correspondingly to the switch pattern to insert therein a conductor member, a fixing leg extending from the terminal housing to be fixed by clamping the circuit board, and a switch terminal positioned substantially opposed to the power source pattern and electrically connected with the conductor member inserted in the recess, to be elastically deformed into possible contact with the power source pattern.

A further electronic device switch according to the invention has a plurality of switch patterns formed in an array form in a position close to a peripheral edge on a surface of a circuit board, a power source pattern formed on a back surface of the circuit board, conductor parts sandwiching an insulating part, the conductor parts being to be fixed by clamping the circuit board, and a conductive contact provided on a button to contact both of the conductor parts.

A further electronic device switch according to the invention has a plurality of switch patterns formed in a position close to a peripheral edge on a surface of a circuit board, a power source pattern formed on a side surface of the circuit board, a terminal having a pressurizing conductive rubber sandwiched by conductor parts, the conductor parts clamping the circuit board to fix the terminal and contacting any of the switch patterns, whereby urging a button provides an electrical conduction between the power source pattern and the SW switch pattern through the pressurizing conductive rubber.

BRIEF DESCRIPTION OF THE DRAWINGS

FIG. 1 is a perspective view showing an electronic-device switch structure according to Embodiment 1 of the present invention;

FIG. 4 are explanatory views showing an electronic-device switch structure according to Embodiment 3 of the invention;

DETAILED DESCRIPTION OF THE PREFERRED EMBODIMENTS

The present invention will now be explained in detail with reference to the drawings. It is noted that the invention should not be limited by the embodiments thereof. Meanwhile, the embodiments include those for the person skilled in the art to replace and ready to carry out or those substantially the same as them.

(Embodiment 1)

FIG. 1 is a perspective view depicting a switch structure of an electronic device according to Embodiment 1 of the invention. FIG. 2 are explanatory views depicting terminals of the switch structure shown in FIG. 1 and an assembly state thereof. The electronic device has a circuit board 1 having an electronic circuit, such as an IC, mounted thereon (not shown). Electrical connection is provided between the electronic circuit and a switch (SW) pattern formed on the circuit board 1.

The circuit board 1, in a disk form, has SW patterns 2–5 formed in a concentric, quadruple ring form in positions close to an end edge on an upper surface thereof. Also, a VDD (plus power source) pattern 6 is formed in a ring form on a side surface of the circuit board 1. The SW patterns 2–5 are formed equidistantly and concentrically, the respective of which are connected to the electronic circuit mounted on the circuit board 1 to serve as switches.

For example, in the example of FIG. 2, four terminals 7–10 are prepared to operate as a switch by the four buttons 11 provided on a not-shown exterior. The terminals 7–10 are each formed of an electrically conductive metal material by being bent in a squared U-form. Specifically, a support surface a has two fixing legs b projecting therefrom, wherein the fixing leg b is bent at its root and intermediate point. The fixing leg b, at its end, is formed in a semicircular form by pressing. Meanwhile, a connection leg c projects from the support surface a, at a side opposite to the two fixing leg b. This is similarly pressed at its tip into a semicircular form. Furthermore, a switch terminal d projects at between the two fixing legs b projecting from the support surface a, to serve as a switch. The switch terminal d is bent at its root to have an end formed as a free end.

Figure 2A:
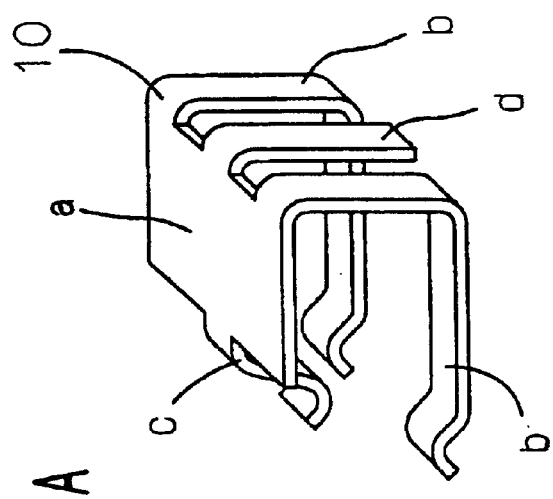
FIG. 2 are explanatory views showing terminals in the switch structure shown in FIG. 1 and assembly states thereof.
Figure 2B:
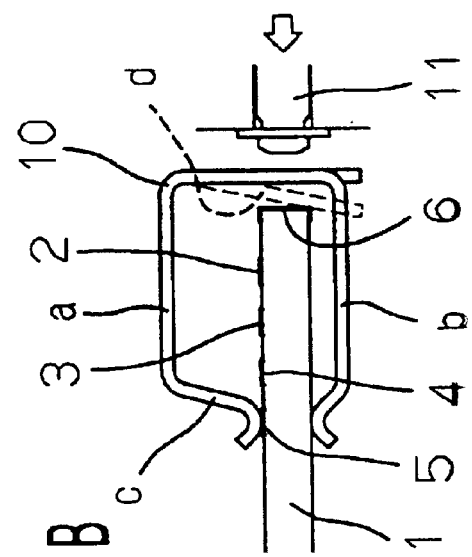
Figure 2C:
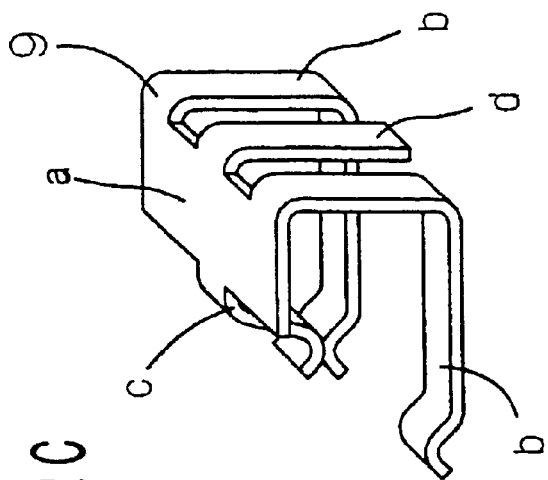
Figure 2D:
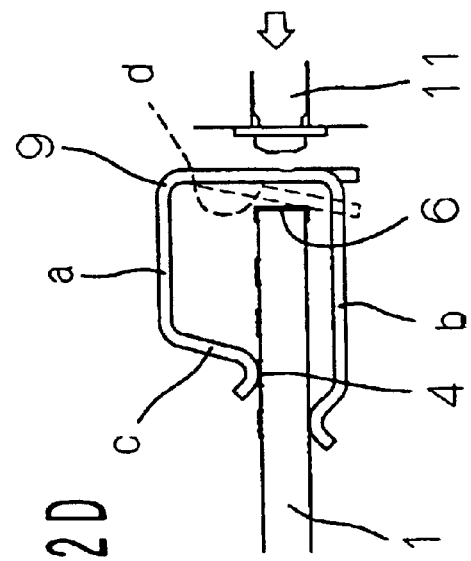
Figure 2E:
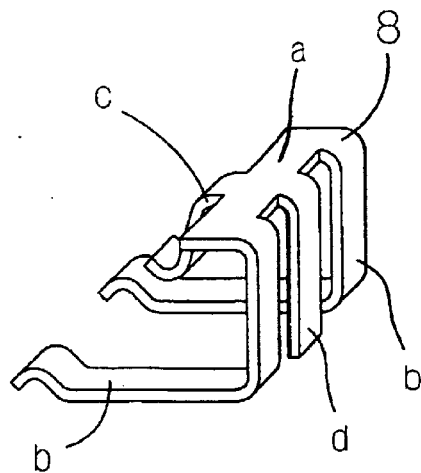
Figure 2F:
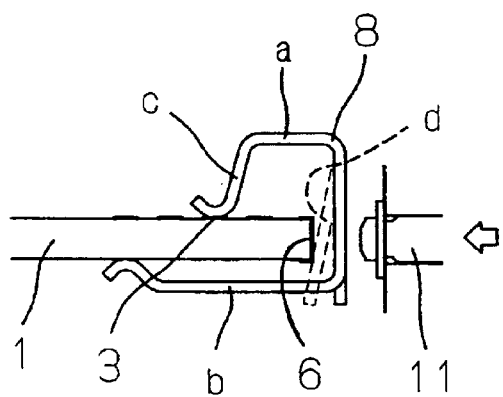
Figure 2G:
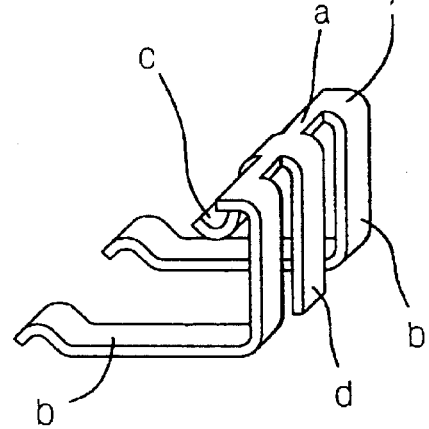
Figure 2H:
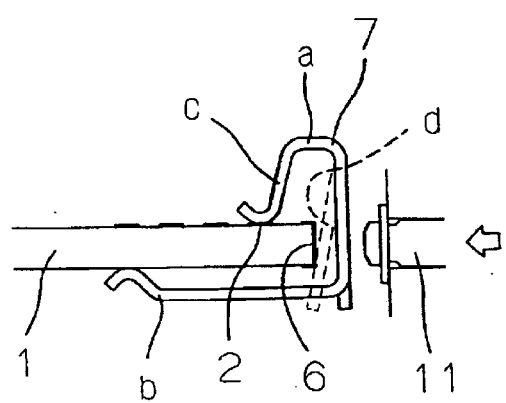

As shown in FIGS. 2A, 2C, 2E and 2G, the terminals 7–10 are to be fixed in a manner clamping the end edge of the circuit board 1, wherein the connection legs c are different in position. The connection legs c have a same pitch in length as a wiring pitch of the SW patterns 2–5. Due to this, the connection leg c of the terminal 10 shown in FIG. 2A is connected with the innermost SW pattern 5, as shown in FIG. 2B. The connection leg c of the terminal 9 shown in FIG. 2C is connected with the next SW pattern 4, as shown in FIG. 2D. The connection leg c of the terminal 8 shown in FIG. 2E is connected with the further next SW pattern 3, as shown in FIG. 2F. The connection leg c of the terminal 7 shown in FIG. 2G is connected with the outermost SW pattern 2, as shown in FIG. 2H.

Meanwhile, the terminals 7–10 are each fixed in a manner claming the circuit board 1 by the fixing legs b and the connection leg c, as shown in FIGS. 2B, 2D, 2F and 2H. When the circuit board 1 is accommodated in an exterior, the buttons 11 are arranged in the positions of the terminals 7–10. According to the switch structure, by pushing the button 11 (in an arrow direction in FIG. 2), the switch terminal d is deflected to contact the VDD pattern 6 on the side surface of the circuit board 1 (contact state is shown by the dotted line). This places a particular SW pattern 2–5 into a state of electrical contact with the VDD pattern 6.

Incidentally, because the terminals 7–10 are fixed clamping the circuit board 1 by the fixing legs b and the connection leg c, there is a possibility of a positional deviation due to a force of upon pushing the button 11. As positional-deviation preventing means for the terminals 7–10 in this case, it is preferred to engage and position a part of the terminals 7–10 with the exterior or to bond the fixing legs b to the circuit board 1 when the circuit board 1 is accommodated in the exterior.

The terminals 7–10 can be fixed to clamp the circuit board 1 at any circumferential position of the circuit board 1, thereby structuring a switch. For example, in FIG. 1, in the case there are exterior buttons 11 at four points, the terminals 7–10 may be respectively attached in the positions corresponding to the relevant positions. Consequently, in the case of using the circuit board 1 in a different exterior, a switch can be structured depending upon the position of the buttons 11 of the exterior.

Incidentally, although the above example explained on the case with four switches, the invention is not limited to that structure. Also, where four ring-formed SW patterns are formed on the circuit board 1, a switch may be structured by using three terminals (the remaining SW pattern not used). Furthermore, the SW patterns 2–5 are not necessarily in a complete ring form. They may be a semicircular ring form, for example. In the case the circuit board 1 is rectangular, the SW patterns 2–5 are preferably rectangular matched to the circuit board 1. In brief, included in the invention are those capable of configuring a switch structure by attaching the terminals 7–10 in free positions on the circuit board 1.

(Embodiment 2)

FIG. 3 are structural views showing a switch structure of an electronic device according to Embodiment 2 of the invention. In the switch structure 20, knob-like fixing legs 22 are provided at both ends of a terminal housing 21 as shown in FIGS. 3A and 3B. Furthermore, a switch terminal 23 projects, by bending, at between the fixing legs 22. The structures of a circuit board 1 and SW patterns 2–5 provided on an upper surface thereof are the same as those of Embodiment 1. In the terminal housing 21, recesses 25 are formed in positions corresponding to the SW patterns 2–5 in order to insert a connection member 24 therein. By inserting a metal-piece connection member 24 in the recess 25, a conduction state is available to a particular SW pattern 2–5.

For example, in the case to connect with the innermost SW pattern 5, a connection member 24 is inserted in the recess 25 positioned innermost of the terminal housing 21. In this state, the circuit board 1 is clamped and fixed by an elastic force of the fixing legs 22. In a state the terminal housing 21 is fixed on the circuit board 1, the switch terminal 23 and the switch pattern 5 are placed in a conduction state through the connecting member 24 (see FIG. 3C). Also, the fixing legs 22 is integrally formed with the terminal housing 21. In a state the fixing legs 22, at its root, is in contact with the side surface of the circuit board 1, a predetermined gap is obtained between the switch terminal 23 and the VDD pattern 6 on the side surface of the circuit board 1. Consequently, even when the switch terminal 23 is pushed by the button 27 of the exterior 26, there is no deviation of the terminal housing 21 in a direction the button 27 is pushed because the terminal housing 21 is positioned by the fixing legs 22 and the side surface of the circuit board 1.

Figure 3A:
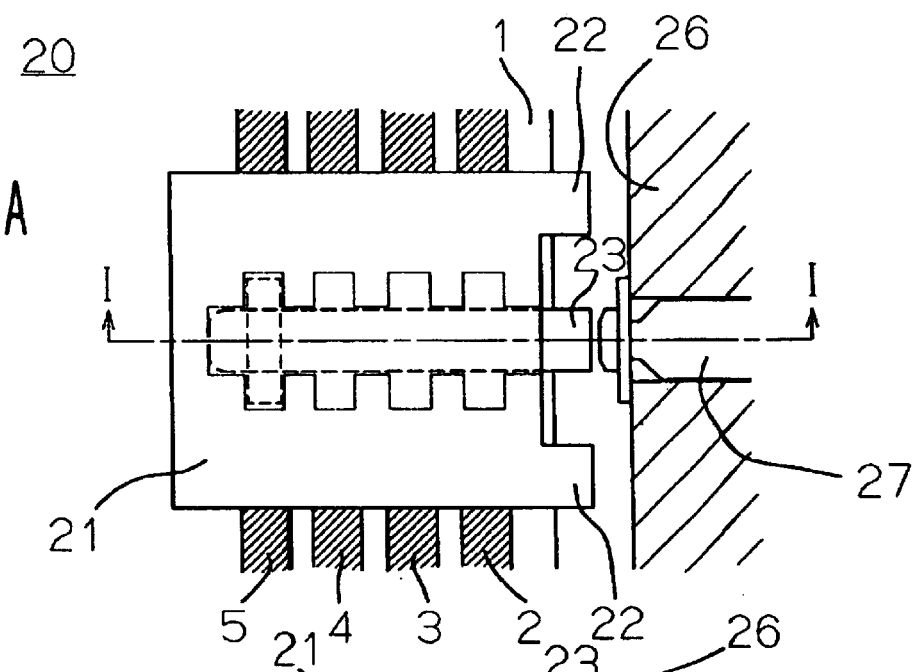
FIG. 3 are structural views showing an electronic-device switch structure according to Embodiment 2 of the invention.
Figure 3B:
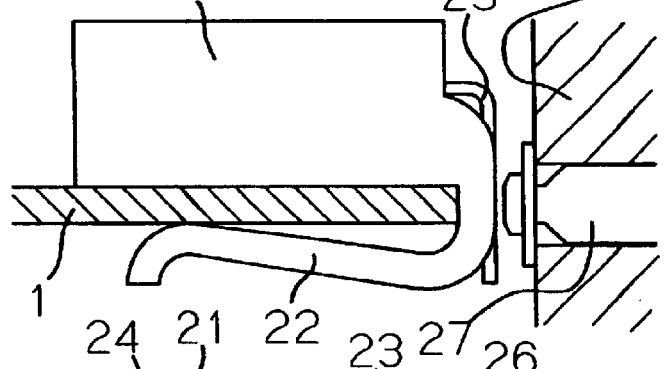
Figure 3C:
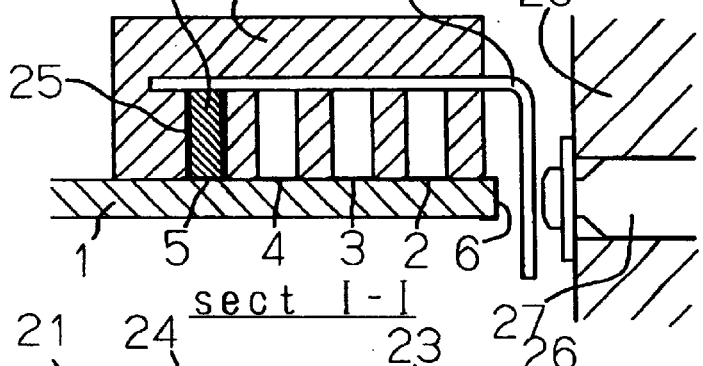
Figure 3D:
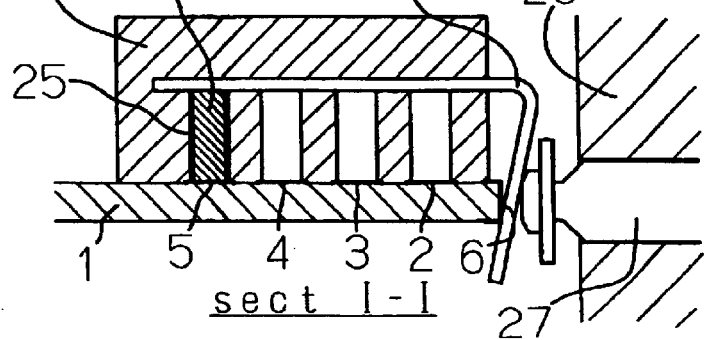

In this switch structure 20, by pushing in the button 27 provided on the exterior 26, the head of the same is put in abutment against the switch terminal 23, whereby the switch terminal 23 deflects into a contact with the VDD pattern 6, as shown in FIG. 3D. This electrically connects between the VDD pattern 6 and a predetermined one of the SW patterns 2–5 through the switch terminal 23 and conduction member 24. According to the switch structure 20, there is no need to prepare terminals based on the kinds of ring-formed SW patterns 2–5 as required in the terminals 7–10 of Embodiment 1, i.e. the mere relevant terminal is satisfactory. Namely, by inserting the conduction member 24 in the recess 25, conduction is available with a desired one of the SW patterns 2–5.

In the switch structure 20, a switch can be structured by clamping and fixing the circuit board 1 in any circumferential position of the circuit board 1. Accordingly, there is no need to change the electronic-device circuit board design due to a change in the exterior, e.g. change of button position. Incidentally, in the above example, a conductor member 24 is inserted in the recess 25 of the terminal housing 21. However, in the case, conversely, conduction members 24 are inserted in all the recesses 25, the conduction members 24 to contact the other SW patterns than a desired SW pattern may be blocked by an insulating tape or the like. This can also provides an electrical connection at between a desired one of the SW pattern 2–5 and the VDD pattern 6.

(Embodiment 3)

FIG. 4 are explanatory views showing a switch structure of an electronic device according to Embodiment 3 of the invention. In this switch structure 30, ring-formed SW patterns 2–5 are formed in positions close to the peripheral edge similarly to Embodiment 1 and on the both surfaces of the circuit board 1, and a VDD pattern 6 is formed on the side surface of the circuit board 1. Specifically, ring-formed SW patterns 2–5 are doubly formed, with the same diameters, on the both surfaces. A terminal 31 has two fixing legs b projecting from a support surface a to be bent into a squared U-form, as shown in FIG. 4D. Also, a connection leg c projects from the support surface a, at an end opposite to the fixing leg b. A switch terminal d projects at between the fixing legs b.

In the case SW patterns 2–5 are formed on the both surfaces of the circuit board 1, the terminal 31 can be fixed on the circuit board 1 by clamping it as shown in FIG. 4A, or otherwise the terminal 31 in an inverted position may be fixed on the circuit board 1 by clamping it, as shown in FIG. 4B. Consequently, two kinds of switches can be structured by one terminal 31. Meanwhile, in the case of contacting the SW patterns 2–5 different in diameter, it is satisfactory to use those different in the pitch of the connection leg c (see FIG. 4C). In case the terminal 31 is used in an inverted position, contact can be made between the SW patterns 2–5 on the back surface and the connection leg c.

In this structure, when a button 33 on an exterior 32 is pushed in, the switch terminal d deflects and contacts the VDD pattern 6. This places the VDD pattern 6 and the SW patterns 2–5 into electrical contact. According to the above switch structure, a switch can be structured by fixation clamping the circuit board 1 in any circumferential position of the circuit board 1. For this reason, there is no need to change the design of the electronic-module circuit board 1 due to a change of the exterior, such as button position change.

(Embodiment 4)

Figure 5A:
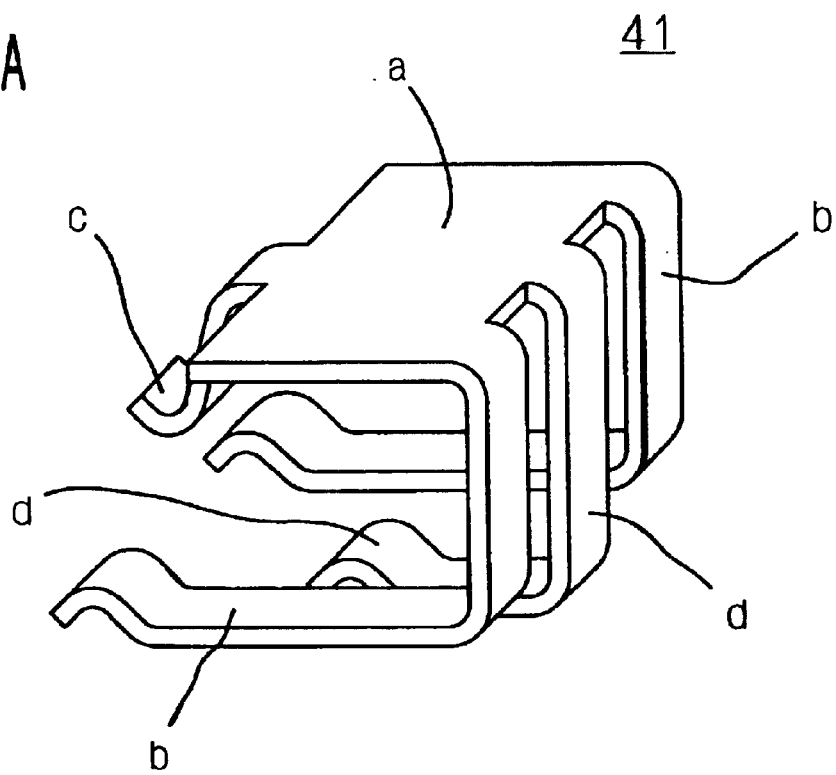
FIG. 5 are explanatory views showing an electronic-device switch structure according to Embodiment 4 of the invention.

FIG. 5 are explanatory views showing a switch structure of an electronic device according to Embodiment 4 of the invention. As shown in FIG. 5A, a terminal 41 of Embodiment 4 is characterized in that the switch terminal d can be pushed at a side of or above the circuit board 1. Namely, in a certain exterior design, a button 42 is possibly provided not at an side of the exterior but at a front thereof. In this case, in order to cope with a front button, it is a conventional practice to form an exclusive SW pattern on a circuit board and arrange a rubber switch on this SW pattern.

Contrary to this, the terminal 41 of the invention has two fixing legs b projecting from a support surface a wherein the fixing leg b is bent at its root and intermediate point. Also, a switch terminal d projects at between the fixing legs b. The switch terminal d is bent at its root and intermediate point similarly to the fixing leg b. This is somewhat retracted rather than the fixing leg b so that, when the fixing legs b are fixed on the back surface of the circuit board 1, the switch terminal d can be placed in a floating state.

Meanwhile, a connection leg c projects from the support surface a, a tip of which is bent in a semicircular form. SW patterns 2–5 are formed in concentric ring forms similarly to Embodiment 1 on an upper surface of the circuit board 1. On a side surface of the circuit board 1, a VDD pattern 6 is formed. In case the terminal 41 is fixed on the circuit board 1 in a manner clamping it, the switch terminal d is placed in a floating state as noted before. First, when a button 42s provided on the exterior is pushed in, the tip of the button 42s abuts against an arm of the switch terminal d to deflect the switch terminal d. This places the switch terminal d and the VDD pattern 6 into contact. Thus, the VDD pattern 6 and the SW patterns 2–5 are electrically connected together.

Meanwhile, in the case a button 42f is arranged at a front of the exterior, the button 42f, if pushed in, abuts against and deflects the switch terminal d. This places the switch terminal d and the VDD pattern 6 into contact, thereby electrically connecting between the VDD pattern 6 and the SW patterns 2–5. According to the above structure, the terminal 41 can cope with the exterior button 42 if arranged at a side or at a front.

Figure 5B:
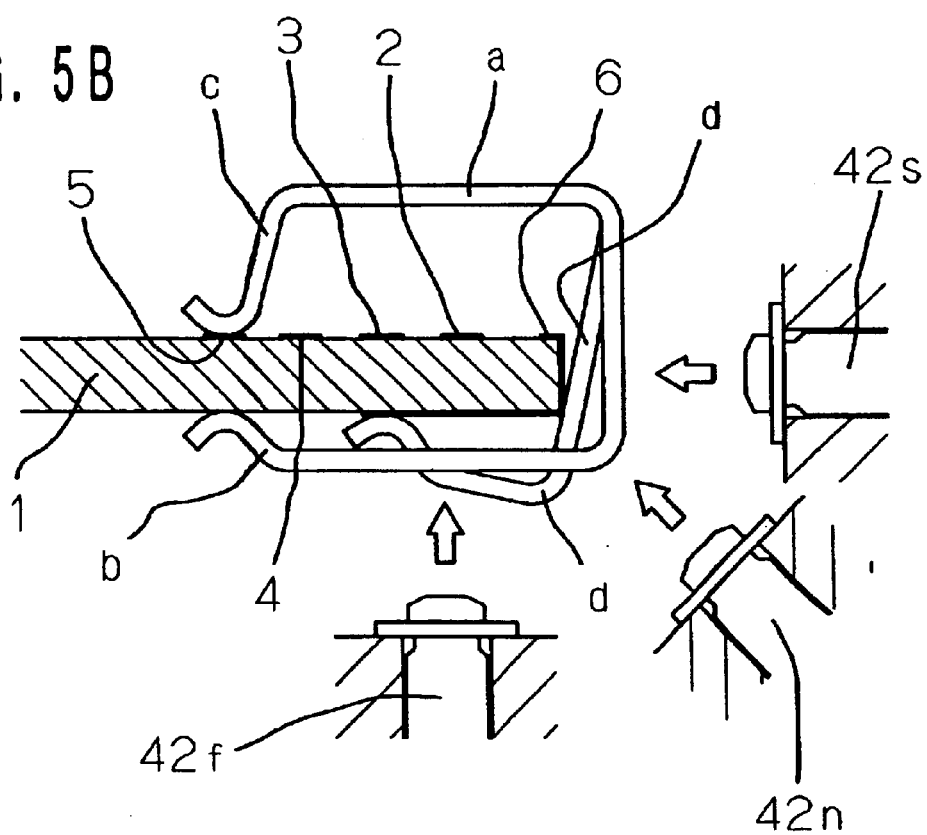

Incidentally, because the pitch of connection leg c is required in plurality matched to the pitch of the SW patterns 2–5, prepared are terminals 41 in plurality having different pitches. Meanwhile, in the case an exterior button 42n is obliquely arranged as shown in FIG. 5B, the button 42n at its head can pushes inward and deflect the switch terminal d. Accordingly, such button arrangement can be coped with.

(Embodiment 5)

Figure 6A:
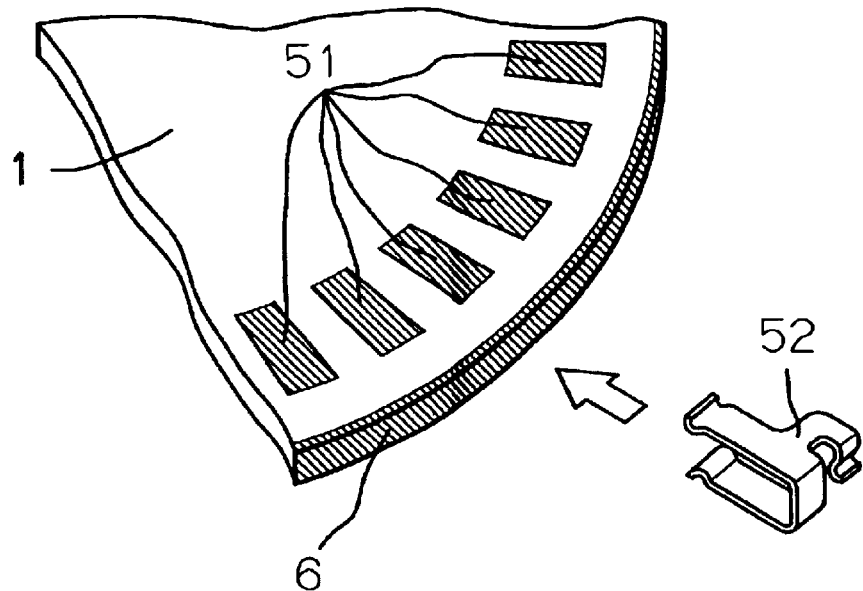
FIG. 6 are explanatory views showing an electronic-device switch structure according to Embodiment 5 of the invention.
Figure 6B:
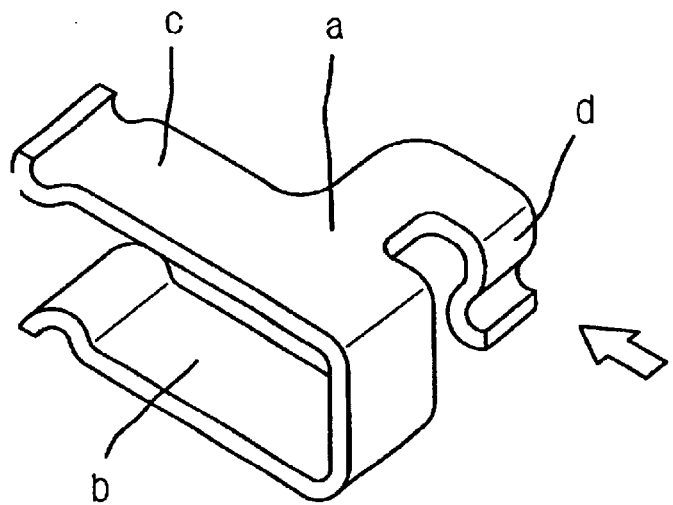

FIG. 6 are illustrative views showing a switch structure of an electronic device according to Embodiment 5 of the invention. In this switch structure 50, an SW pattern 51 is formed in an array form in an peripheral edge on the circuit board 1 while a VDD pattern 6 is formed on a side surface thereof, as shown in FIG. 6A. A terminal 52 is formed in a squared U-form as shown in FIG. 6B, to have a fixing leg b and a connection leg c each bent in a semicircular form at an end thereof. Also, a support surface a is formed in the connection leg c of the terminal 52, so that a switch terminal d is formed in the support surface a. The switch terminal d is bent in a semicircular form at its end.

Figure 6C:
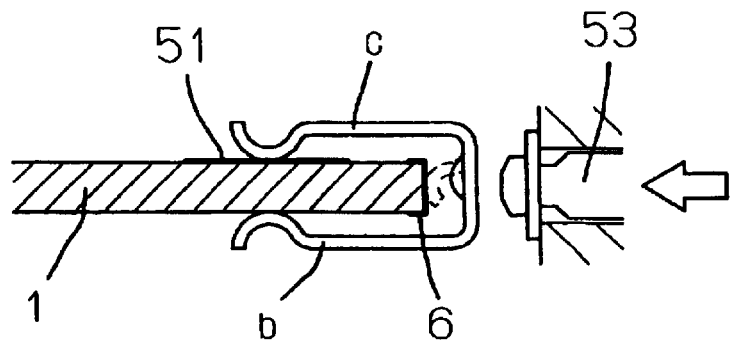

FIG. 6C shows a state the terminal 52 is fixed on the circuit board 1. The terminal 52 is fixed on the circuit board 1 by clamping it by the fixing leg b and the connection leg c. In this state, when the switch terminal d is pushed in by a button 53 provided on the exterior, the switch terminal d deflects and contacts the VDD pattern 6. This places the VDD pattern 6 and the SW pattern 51 into electrical contact.

The terminal 52 can be changed in position at a pitch interval of the SW pattern 51 provided in an array form. The array arrangement of SW pattern 51 is effective for an increased number of switches, e.g. 5 or more. Namely, forming a plurality of SW patterns in a concentric-rings form increases the area for the SW patterns to increase the size of the terminal. However, the array arrangement of an SW pattern 52 suppresses the area of the SW pattern 51 from increasing and hence prevents the terminal 52 from size-increasing.

(Embodiment 6)

Figure 7A:
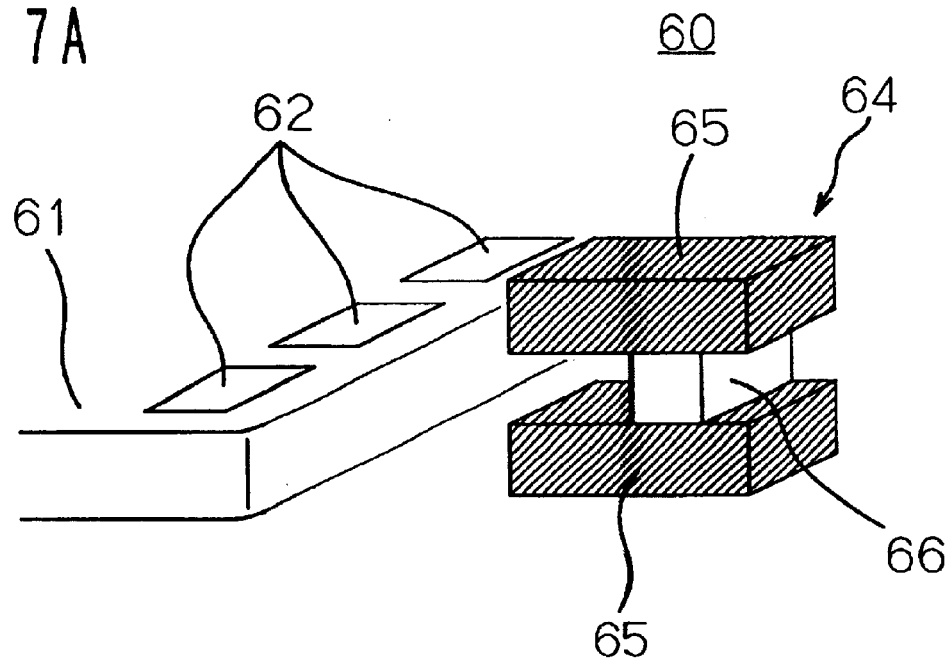
FIG. 7 are explanatory views showing an electronic-device switch structure according to Embodiment 6 of the invention.
Figure 7B:
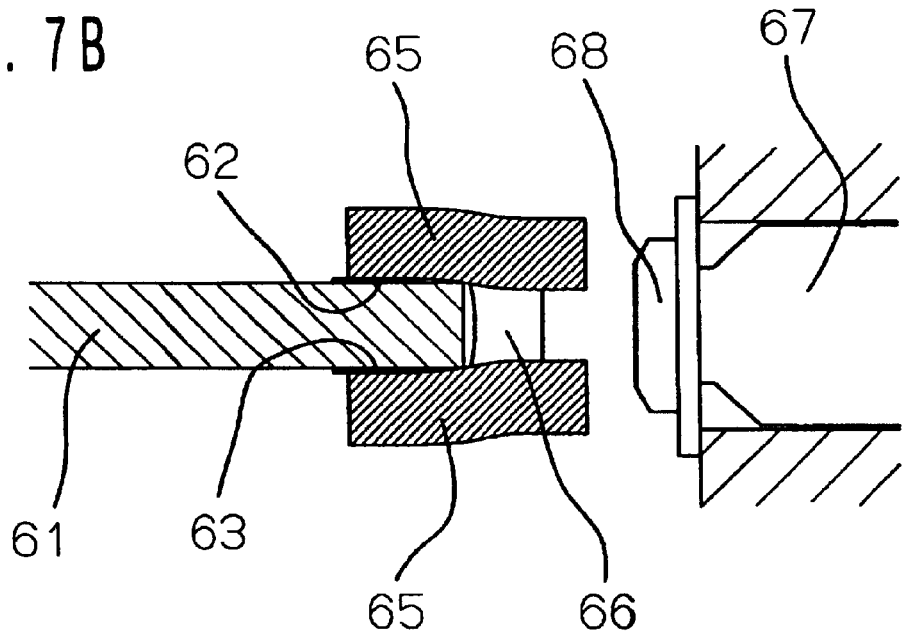

FIG. 7 are explanatory views showing a switch structure of an electronic device according to Embodiment 6 of the invention. In this switch structure 60, an SW pattern 62 is formed in an array form on a surface of a circuit board 61 while a ring-formed VDD pattern 63 is formed on a back surface thereof. A terminal 64 has an insulating part 66 interposed between two conductor parts 65, thus being made generally in an H-form in the entire. The conductor part 65 uses a conductive rubber provided with a conductivity by adding a metal powder to a rubber member. The insulating part 66 uses a rubber not containing a metal powder. Incidentally, the conductor part 65 and the insulating part 66 may be bonded together or integrally injection-molded.

The terminal 64 is fixed on the circuit board 61 in a manner clamping it by the conductor parts 65. The terminal 64 may be positioned by an abutment between the insulating part 66 and the side surface of the circuit board 61. Meanwhile, a conductive contact 68 of a metal or conductive rubber is provided on a head of a button 67 provided in the exterior. When the button 67 is pushed in, the contact 68 at the button head contacts bridging the both conductor parts 65, thus electrically connects between them. As a result, conduction is provided between the VDD pattern 63 and a predetermined SW pattern 62. Meanwhile, the terminal 64 can be freely set in position at a pitch interval of the SW pattern 62 arranged in an array form.

Figure 8A:
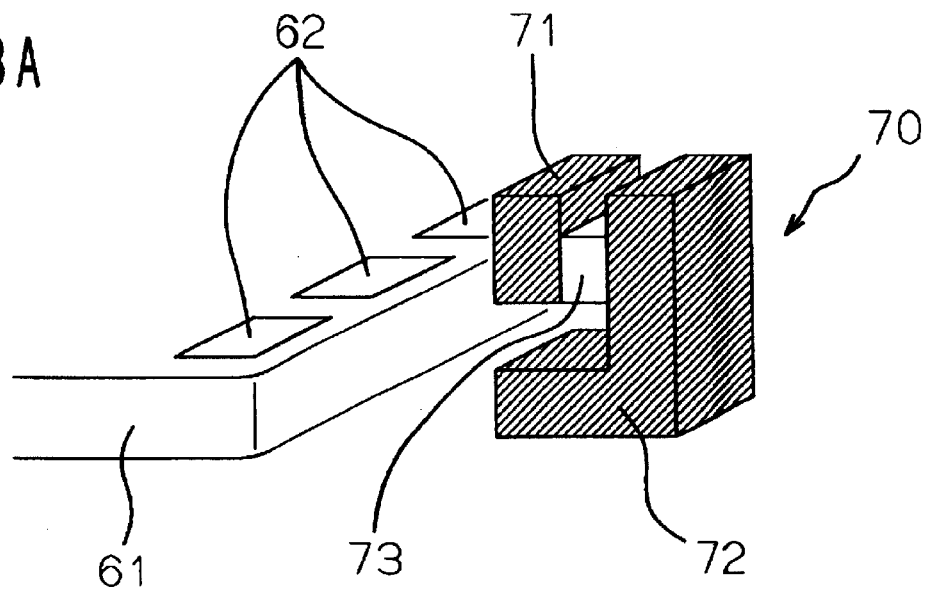
FIG. 8 are explanatory views showing a modification to a switch structure shown in FIG. 7.

Meanwhile, FIG. 8 show a modification of the switch structure. This switch structure 70 is a structure having a button arranged at a front of the exterior, as shown in FIG. 8A. A switch pattern 62 is arranged in an array form on a surface of a circuit board 61, similarly to the switch structure shown in FIG. 7. Furthermore, a ring-formed VDD pattern 63 is formed on a back surface. Meanwhile, a terminal 70 is in a Y-form, having an I-formed conductor part 71 and an L-formed conductor part 72 that are connected through an insulating part 73. Note that the conductor parts 71, 72 and the insulating part 73 may be bonded together or integrally injection-molded.

Figure 8B:
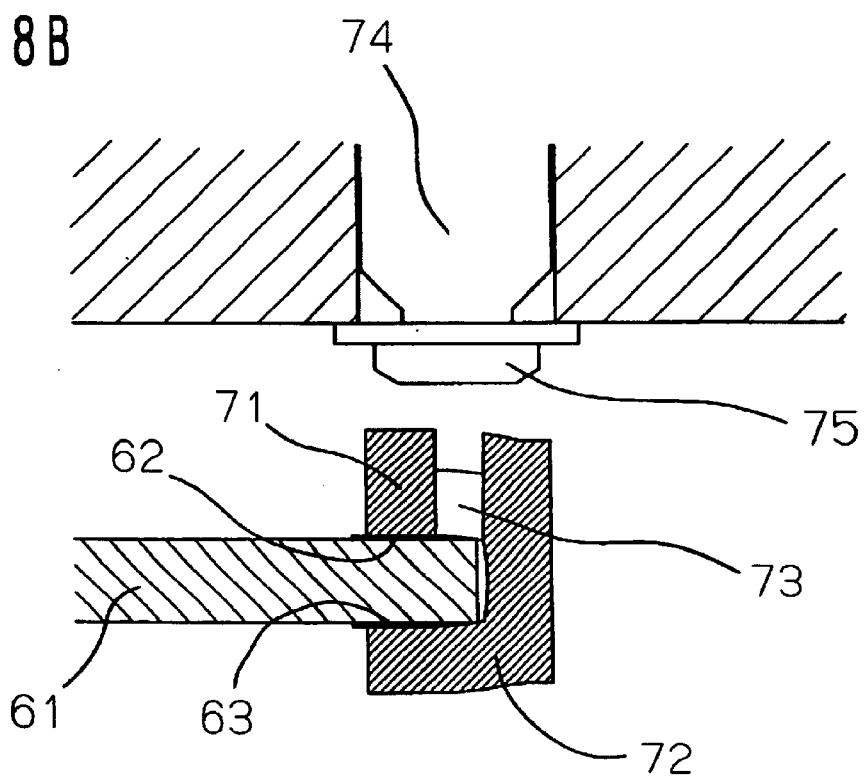

As shown in FIG. 8B, the terminal 70 is fixed on the circuit board 61 in a manner clamping it by the conductor parts 71, 72, to place into contact between the conductor parts 71, 72 and the SW pattern 62 as well as between the conductor parts 71, 72 and the VDD pattern 63. Then, the contact 75 at the head of the button 74 is pushed on the both of the conductor parts 71 and 72 by the button 74 arranged at a front of the exterior. This places the conductor parts 71 and 72 into connection and the SW pattern 62 and the VDD pattern 63 into electrical conduction state. Also, the terminal 70 can be freely set in position at a pitch interval of the SW pattern 62 arranged in an array form.

Figure 9:
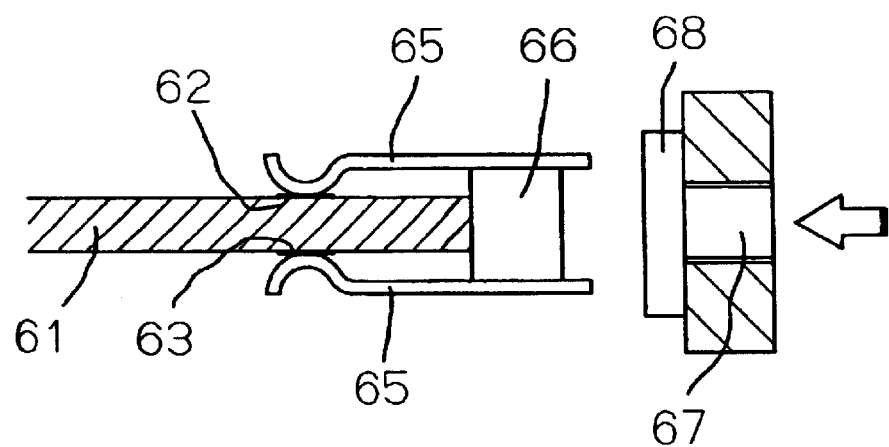
FIG. 9 is an explanatory view showing a modification to a switch structure shown in FIG. 7.

Also, the effect is similarly available when making the conductor parts 71, 72 by metal plates as shown in FIG. 9 in place of the conductive rubber. In this case, the conductor parts 65, at its end, is bent in a semicircular form and bonded with the insulating-part rubber 66 through an adhesive. Also, a conductive contact 68, such as of conductive rubber or metal, is provided at the head of the button 67.

(Embodiment 7)

Figure 10A:
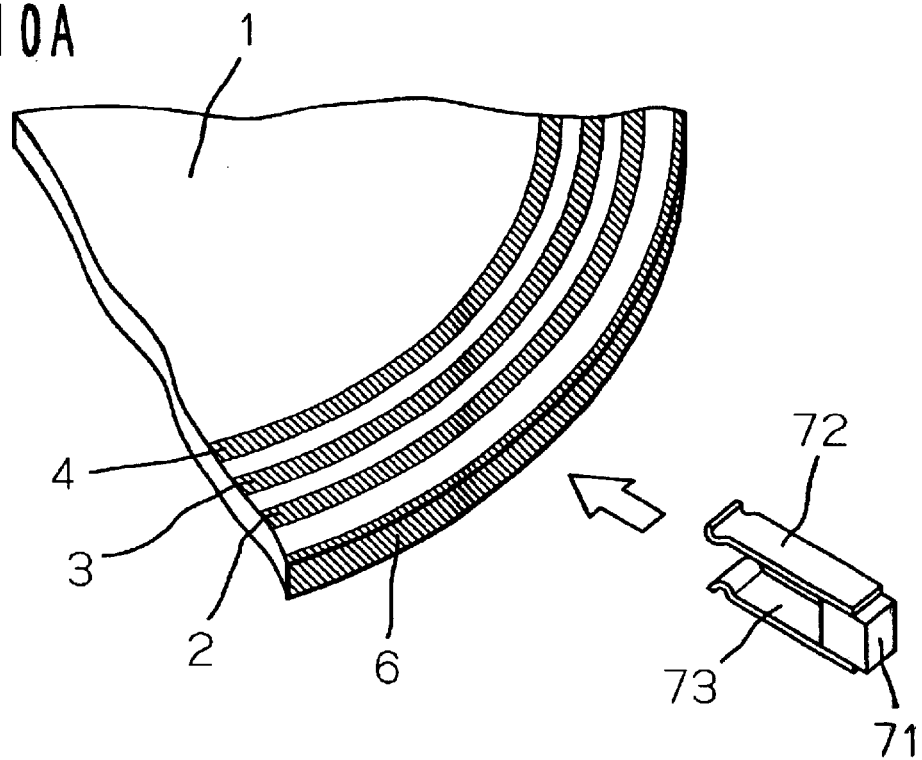
FIG. 10 are explanatory views showing an electronic-device switch structure according to Embodiment 7 of the invention.

FIG. 10 are explanatory views showing a switch structure of an electronic device according to Embodiment 7 of the invention. This switch structure 70 has a connection leg 72 and a fixing leg 73 provided at opposite surfaces of a pressurizing conductive rubber 71, as shown in FIG. 10A. The pressurizing conductive rubber 71 somewhat projects at the ends of the connection leg 72 and fixing leg 73. Treble SW patterns 2–4 are formed concentrically in ring forms on a circuit board 1. Also, a VDD pattern 6 is formed in a ring form on a side surface of the circuit board 1.

Figure 10B:
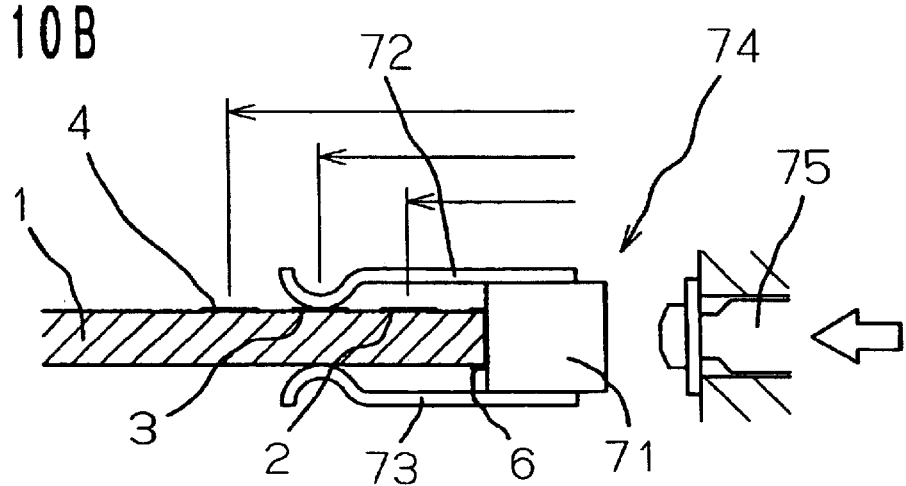
Figure 11:
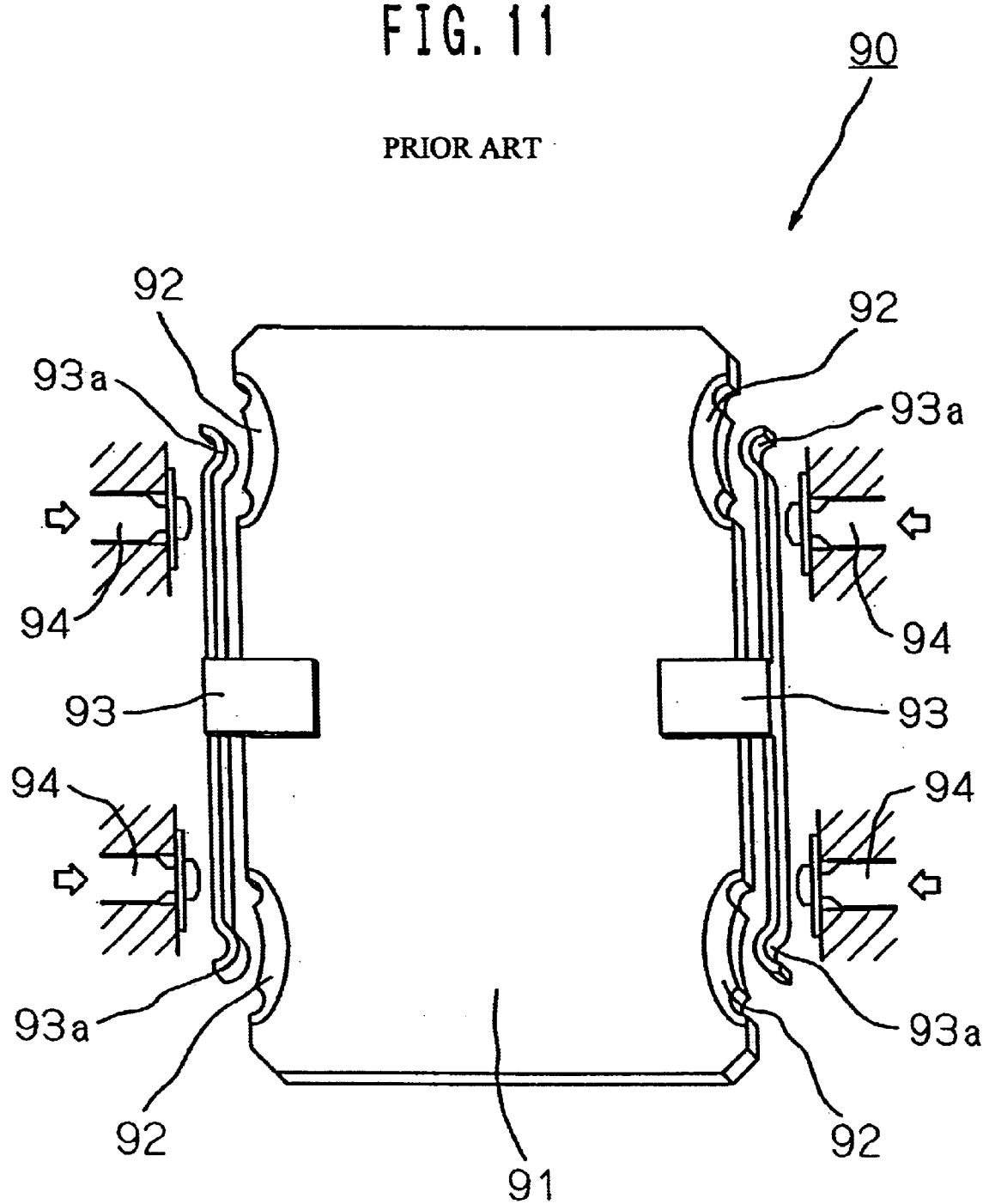
FIG. 11 is a concept view showing a conventional electronic-device switch structure.

A terminal 74 is fixed on the circuit board 1 in a manner clamping it by the fixing leg 73 and the connection leg 72, as shown in FIG. 10B. In this state, the connection leg 72 contacts a predetermined one of the SW patterns 2–4. Herein, the pressurizing conductive rubber 71 is placed in contact with the VDD pattern 6 of the circuit board 1. Incidentally, prepared are terminals 74 having respective connection legs 73 having pitches corresponding to the pitches of the SW patterns 2–4.

When a button 75 is pushed to pressurize the pressurizing conductive rubber 71, a conduction state is obtained in the pressurizing conductive rubber 71 and connection leg 72. This places the VDD pattern 6 into electrical contact with a predetermined one of the SW patterns 2–4. Meanwhile, because the terminal 74 is structured with the SW patterns 2–4 and VDD pattern 6 in ring forms similarly to the switch structure shown in Embodiment 1, it is possible to freely select a fixing position of the terminal 74. Incidentally, although Embodiments 1–7 are the forms to conduct between the VDD pattern and the switch pattern, conduction may be between a VSS (minus power source) and a switch pattern.

As explained in the above, the switch of an electronic device of the invention can be used without changing the design of a circuit board even where changing an exterior design, particularly button position, of an electronic device.

What is claimed is:

1. An electronic device switch comprising:
   a plurality of switch patterns formed in positions close to a peripheral edge on a surface of a circuit board;
   a power source pattern formed on a side surface of the circuit board; and
   a terminal having a fixing leg, a connection leg disposed in contact with any of the switch patterns and cooperating with the fixing leg to clamp the terminal to the circuit board, and a switch terminal electrically connected with the connection leg and for undergoing plastic deformation to contact the power source pattern.

2. An electronic device switch according to claim 1; wherein the switch terminal is bent so that it extends toward a surface of the circuit board opposite to a the surface thereof on which the switch patterns are formed.

3. An electronic device switch according to claim 1; wherein the switch patterns are formed in an array form.

4. An electronic device switch according to claim 1; wherein the switch patterns are disposed parallel to one another.

5. An electronic device switch according to claim 1; wherein the switch patterns are concentrically formed on the surface of the circuit board.

6. An electronic device switch comprising:
   a plurality of switch patterns formed in positions close to a peripheral edge on each of opposite surfaces of a circuit board;
   a power source pattern formed on a side surface of the circuit board; and a terminal having a fixing leg, a connection leg disposed in contact with any of the switch patterns in either an ordinal position or an inverted position of the terminal and cooperating with the fixing leg to clamp the terminal to the circuit board, and a switch terminal electrically connected with the connection leg and for undergoing elastic deformation to contact the power source pattern.

7. An electronic device switch according to claim 6; wherein the switch patterns are formed in an array form.

8. An electronic device switch according to claim 6; wherein the switch patterns are disposed parallel to one another.

9. An electronic device switch according to claim 6; wherein the switch patterns are concentrically formed on the surface of the circuit board.

10. An electronic device switch comprising:

a plurality of switch patterns formed in positions close to a peripheral edge on a surface of a circuit board;

a power source pattern formed on a side surface of the circuit board; and a terminal comprised of a terminal housing having a plurality of recesses each corresponding to one of the switch patterns and for selectively receiving therein a conductor member, a fixing leg extending from the terminal housing for clamping the terminal to the circuit board, and a switch terminal for electrical connection with the conductor member and for undergoing elastic deformation to contact the power source pattern.

11. An electronic device switch according to claim 10; wherein the switch patterns are disposed parallel to one another.

12. An electronic device switch according to claim 10; wherein the switch patterns are concentrically formed on the surface of the circuit board.

13. An electronic device switch comprising:

a plurality of switch patterns formed in an array form in a position close to a peripheral edge on a first surface of a circuit board;

a power source pattern formed on a second surface of the circuit board opposite the first surface thereof;

a terminal having a pair of spaced-apart conductor parts each for connection to a respective one of the switch patterns and the power source pattern, and an insulating part disposed between the conductor parts; and a button having a conductive contact for contacting both of the conductor parts.

14. An electronic device switch comprising:

a plurality of switch patterns formed in a position close to a peripheral edge on a surface of a circuit board;

a power source pattern formed on a side surface of the circuit board;

a terminal having a pair of conductor parts and a pressurizing conductive rubber disposed between the conductor parts, the conductor parts being configured to be clamped to the circuit board so that the conductor parts contact any of the switch patterns and the pressurizing conductive rubber contacts the power source pattern and so that upon pressurization of the pressurizing conductive rubber, the conductor parts are electrically connected to the pressurizing conductive rubber.

15. An electronic device switch comprising:

a plurality of switch patterns formed on at least one main surface of a circuit board;

a power source pattern formed on a side surface of the circuit board; and a terminal having a connection leg and an elastic switch terminal electrically connected to the connection leg, the terminal being configured to be mounted on the circuit board so that the connection leg is disposed in electrical contact with a preselected one of the switch patterns and the elastic switch terminal is elastically deformable for contacting the power source pattern to thereby bring the preselected switch pattern into electrical contact with the power source pattern.

16. An electronic device switch according to claim 15; wherein the terminal has at least one fixing leg for cooperation with the connection leg to securely mount the terminal on the circuit board.

17. An electronic device switch according to claim 16; wherein the at least one fixing leg comprises two fixing legs.

18. An electronic device switch according to claim 15; wherein the switch patterns are disposed parallel to one another.

19. An electronic device switch according to claim 15; wherein the switch patterns are concentrically formed on the main surface of the circuit board.

20. An electronic device switch according to claim 15; wherein the switch patterns are formed on opposite main surfaces of the circuit board.

* * * * *